(12) United States Patent
Curt et al.

(10) Patent No.: US 9,202,383 B2
(45) Date of Patent: Dec. 1, 2015

(54) METHOD AND APPARATUS FOR A VOICE-PROMPTED ELECTRICAL HOOKUP

(75) Inventors: Walter Curt, Harrisonburg, VA (US); Christopher Mullins, Penn Laird, VA (US)

(73) Assignee: Power Monitors, Inc., Mount Crawford, VA (US)

( * ) Notice: Subject to any disclaimer, the term of this patent is extended or adjusted under 35 U.S.C. 154(b) by 510 days.

(21) Appl. No.: 12/396,181

(22) Filed: Mar. 2, 2009

(65) Prior Publication Data

US 2009/0226869 A1    Sep. 10, 2009

Related U.S. Application Data

(60) Provisional application No. 61/033,576, filed on Mar. 4, 2008.

(51) Int. Cl.
| | |
|---|---|
| *H02J 3/14* | (2006.01) |
| *G09B 5/04* | (2006.01) |
| *G01R 19/25* | (2006.01) |
| *G09B 23/18* | (2006.01) |
| *H01R 13/641* | (2006.01) |
| *G01R 31/04* | (2006.01) |

(52) U.S. Cl.
CPC .............. *G09B 5/04* (2013.01); *G01R 19/2513* (2013.01); *H02J 3/14* (2013.01); *G01R 31/041* (2013.01); *G01R 31/045* (2013.01); *G09B 23/186* (2013.01); *H01R 13/641* (2013.01)

(58) Field of Classification Search
CPC ..... H02J 3/14; G01R 19/2513; G01R 31/041; G01R 31/045; G09B 23/186; H01R 13/641

USPC ...................... 434/224; 340/635; 361/88, 224
See application file for complete search history.

(56) References Cited

U.S. PATENT DOCUMENTS

| | | | |
|---|---|---|---|
| 2,855,916 | A | 10/1958 | Foster |
| 3,516,063 | A | 6/1970 | Arkin et al. |
| 4,067,054 | A | 1/1978 | Clark |
| 4,540,182 | A | 9/1985 | Clement |
| 4,558,275 | A | 12/1985 | Borowy et al. |
| 4,731,574 | A | 3/1988 | Melbert |

(Continued)

FOREIGN PATENT DOCUMENTS

| | | |
|---|---|---|
| CN | 2765183 Y | 3/2006 |
| DE | 102007026290 | 7/2008 |

(Continued)

OTHER PUBLICATIONS

International Search Report dated May 8, 2009.

(Continued)

*Primary Examiner* — Jack Yip
(74) *Attorney, Agent, or Firm* — Dinsmore & Shohl LLP

(57) ABSTRACT

A method and system for connecting monitoring equipment is provided. A user is provided with instant voice feedback as they are connecting monitoring equipment. Such feedback can reduce or eliminate confusing hookup instructions and enable the user to use both hands to safely connect the equipment without the distraction of looking at hard-to-read probe markings or connection labels. The use of a voice output reduces or avoids problems of poor visibility and reduced hearing in typical industrial environments, using arc flash safety gear.

19 Claims, 4 Drawing Sheets

(56) References Cited

U.S. PATENT DOCUMENTS

| | | |
|---|---|---|
| 4,731,575 A | 3/1988 | Sloan |
| 4,800,492 A | 1/1989 | Johnson et al. |
| 5,083,638 A | 1/1992 | Schneider |
| 5,107,202 A | 4/1992 | Renda |
| 5,241,283 A | 8/1993 | Sutterlin |
| 5,311,422 A * | 5/1994 | Loftin et al. .................. 703/2 |
| 5,410,735 A | 4/1995 | Borchardt et al. |
| 5,420,799 A | 5/1995 | Peterson et al. |
| 5,488,202 A | 1/1996 | Baitz et al. |
| 5,491,463 A | 2/1996 | Sargeant et al. |
| 5,565,783 A | 10/1996 | Lau et al. |
| 5,583,801 A | 12/1996 | Croyle et al. |
| 5,602,794 A | 2/1997 | Javanifard et al. |
| 5,617,286 A | 4/1997 | Jenkins |
| 5,641,898 A * | 6/1997 | Chang .................. 73/114.62 |
| 5,659,453 A | 8/1997 | Russell et al. |
| 5,725,062 A | 3/1998 | Fronek |
| 5,726,646 A | 3/1998 | Bane et al. |
| 5,732,039 A | 3/1998 | Javanifard et al. |
| 5,752,046 A | 5/1998 | Oprescu et al. |
| 5,767,735 A | 6/1998 | Javanifard et al. |
| 5,781,473 A | 7/1998 | Javanifard et al. |
| 5,796,631 A | 8/1998 | Iancu et al. |
| 5,831,538 A | 11/1998 | Schena |
| 5,898,158 A | 4/1999 | Shimizu et al. |
| 5,905,616 A | 5/1999 | Lyke |
| 5,937,386 A | 8/1999 | Frantz |
| 5,939,974 A | 8/1999 | Heagle et al. |
| 5,943,226 A | 8/1999 | Kim |
| 5,993,216 A * | 11/1999 | Stogner .................. 434/29 |
| 6,005,758 A | 12/1999 | Spencer et al. |
| 6,022,315 A | 2/2000 | Iliff |
| 6,034,859 A | 3/2000 | Baumgärtl |
| 6,049,880 A | 4/2000 | Song |
| 6,091,337 A | 7/2000 | Arshad et al. |
| 6,107,862 A | 8/2000 | Mukainakano et al. |
| 6,115,695 A | 9/2000 | Kern |
| 6,151,229 A | 11/2000 | Taub et al. |
| 6,169,406 B1 | 1/2001 | Peschel |
| 6,212,049 B1 | 4/2001 | Spencer et al. |
| 6,222,443 B1 | 4/2001 | Beeson et al. |
| 6,307,425 B1 | 10/2001 | Chevallier et al. |
| 6,313,394 B1 | 11/2001 | Shugar et al. |
| 6,317,031 B1 | 11/2001 | Rickard |
| 6,356,426 B1 | 3/2002 | Dougherty |
| 6,360,177 B1 | 3/2002 | Curt et al. |
| 6,369,642 B1 | 4/2002 | Zeng |
| 6,384,348 B1 | 5/2002 | Haga et al. |
| 6,415,244 B1 | 7/2002 | Dickens et al. |
| 6,437,692 B1 | 8/2002 | Petite et al. |
| 6,545,482 B1 | 4/2003 | Fedirchuk et al. |
| 6,545,529 B2 | 4/2003 | Kim |
| 6,603,218 B1 | 8/2003 | Aisa |
| 6,628,496 B2 | 9/2003 | Montjean |
| 6,633,163 B2 | 10/2003 | Fling |
| 6,633,823 B2 | 10/2003 | Bartone et al. |
| 6,647,024 B1 | 11/2003 | Dombkowski et al. |
| 6,653,945 B2 | 11/2003 | Johnson et al. |
| 6,687,680 B1 | 2/2004 | Iguchi et al. |
| 6,690,594 B2 | 2/2004 | Amarillas et al. |
| 6,704,568 B2 | 3/2004 | Montjean |
| 6,734,682 B2 | 5/2004 | Tallman et al. |
| 6,789,206 B1 | 9/2004 | Wierzbicki et al. |
| 6,792,337 B2 | 9/2004 | Blackett et al. |
| 6,836,099 B1 | 12/2004 | Amarillas et al. |
| 6,842,719 B1 | 1/2005 | Fitzpatrick et al. |
| 6,866,193 B1 | 3/2005 | Shimizu et al. |
| 6,912,678 B1 * | 6/2005 | Floro et al. .................. 714/724 |
| 6,928,564 B2 | 8/2005 | Tada et al. |
| 6,931,445 B2 | 8/2005 | Davis |
| 6,934,396 B1 * | 8/2005 | Leapman .................. 381/59 |
| 6,944,058 B2 | 9/2005 | Wong |
| 6,957,158 B1 | 10/2005 | Hancock et al. |
| 6,961,641 B1 | 11/2005 | Forth et al. |
| 6,993,417 B2 | 1/2006 | Osann, Jr. |
| 6,995,603 B2 | 2/2006 | Chen et al. |
| 7,004,784 B2 | 2/2006 | Castle |
| 7,009,379 B2 | 3/2006 | Ramirez |
| 7,130,722 B2 | 10/2006 | Soni |
| 7,135,850 B2 | 11/2006 | Ramirez |
| 7,177,824 B2 | 2/2007 | Sabongi et al. |
| 7,242,109 B2 | 7/2007 | Beeren |
| 7,348,769 B2 | 3/2008 | Ramirez |
| 7,460,467 B1 | 12/2008 | Corcoran |
| 7,462,952 B2 | 12/2008 | Bailey |
| 7,769,149 B2 | 8/2010 | Berkman |
| 7,795,877 B2 | 9/2010 | Radtke et al. |
| 7,804,280 B2 | 9/2010 | Deaver, Sr. et al. |
| 7,956,673 B2 | 6/2011 | Pan |
| 2002/0008566 A1 | 1/2002 | Taito et al. |
| 2002/0043969 A1 | 4/2002 | Duncan et al. |
| 2002/0063635 A1 | 5/2002 | Shincovich |
| 2002/0082924 A1 | 6/2002 | Koether |
| 2002/0112250 A1 | 8/2002 | Koplar et al. |
| 2002/0130701 A1 | 9/2002 | Kleveland |
| 2002/0143482 A1 | 10/2002 | Karanam et al. |
| 2002/0182570 A1 * | 12/2002 | Croteau et al. .................. 434/107 |
| 2003/0046377 A1 | 3/2003 | Daum et al. |
| 2003/0069796 A1 | 4/2003 | Elwood et al. |
| 2003/0126735 A1 * | 7/2003 | Taniguchi et al. .................. 29/593 |
| 2003/0167178 A1 | 9/2003 | Jarman et al. |
| 2003/0197989 A1 | 10/2003 | Nojima |
| 2003/0224784 A1 | 12/2003 | Hunt et al. |
| 2003/0225713 A1 | 12/2003 | Atkinson et al. |
| 2004/0008023 A1 | 1/2004 | Jang et al. |
| 2004/0024913 A1 | 2/2004 | Ikeda et al. |
| 2004/0124247 A1 | 7/2004 | Watters |
| 2004/0128085 A1 | 7/2004 | Ramirez |
| 2004/0138786 A1 | 7/2004 | Blackett et al. |
| 2004/0138835 A1 | 7/2004 | Ransom et al. |
| 2004/0210621 A1 | 10/2004 | Antonellis |
| 2004/0242087 A1 * | 12/2004 | Hoshina .................. 439/894 |
| 2005/0049921 A1 | 3/2005 | Tengler et al. |
| 2005/0052186 A1 * | 3/2005 | Grube .................. 324/503 |
| 2005/0138432 A1 | 6/2005 | Ransom et al. |
| 2005/0144099 A1 | 6/2005 | Deb et al. |
| 2005/0154490 A1 | 7/2005 | Blaine et al. |
| 2005/0154499 A1 | 7/2005 | Aldridge et al. |
| 2005/0212526 A1 | 9/2005 | Blades |
| 2005/0216349 A1 | 9/2005 | Vaseloff et al. |
| 2005/0256774 A1 | 11/2005 | Clothier et al. |
| 2005/0273183 A1 | 12/2005 | Curt et al. |
| 2006/0047543 A1 | 3/2006 | Moses |
| 2006/0061480 A1 | 3/2006 | Bowman |
| 2006/0062400 A1 * | 3/2006 | Chia-Chun .................. 381/74 |
| 2006/0071776 A1 | 4/2006 | White, II et al. |
| 2006/0087322 A1 | 4/2006 | McCollough, Jr. |
| 2006/0087783 A1 | 4/2006 | Holley |
| 2006/0098371 A1 | 5/2006 | Wambsganss et al. |
| 2006/0111040 A1 | 5/2006 | Jenkins et al. |
| 2006/0114121 A1 | 6/2006 | Cumeralto et al. |
| 2006/0145685 A1 | 7/2006 | Ramirez |
| 2006/0158177 A1 | 7/2006 | Ramirez |
| 2006/0176630 A1 | 8/2006 | Carlino et al. |
| 2006/0181838 A1 | 8/2006 | Ely |
| 2006/0190140 A1 | 8/2006 | Soni |
| 2006/0190209 A1 | 8/2006 | Odom |
| 2006/0218057 A1 | 9/2006 | Fitzpatrick et al. |
| 2006/0244518 A1 | 11/2006 | Byeon et al. |
| 2006/0271244 A1 | 11/2006 | Cumming et al. |
| 2006/0271314 A1 | 11/2006 | Hayes |
| 2007/0010916 A1 | 1/2007 | Rodgers et al. |
| 2007/0053216 A1 | 3/2007 | Alenin |
| 2007/0064622 A1 | 3/2007 | Bi et al. |
| 2007/0078628 A1 * | 4/2007 | Virji et al. .................. 702/183 |
| 2007/0080819 A1 | 4/2007 | Marks et al. |
| 2007/0126569 A1 * | 6/2007 | Dagci .................. 340/531 |
| 2007/0129087 A1 | 6/2007 | Bell |
| 2007/0195711 A1 * | 8/2007 | Morris et al. .................. 370/254 |
| 2007/0286089 A1 | 12/2007 | Nasle et al. |
| 2007/0290845 A1 | 12/2007 | Benjelloun et al. |
| 2008/0024096 A1 | 1/2008 | Pan |
| 2008/0030317 A1 | 2/2008 | Bryant |
| 2008/0042731 A1 | 2/2008 | Daga et al. |

(56) References Cited

U.S. PATENT DOCUMENTS

| | | | |
|---|---|---|---|
| 2008/0106425 | A1 | 5/2008 | Deaver et al. |
| 2008/0109584 | A1* | 5/2008 | Kalwitz ................... 710/104 |
| 2008/0159244 | A1 | 7/2008 | Hunziker |
| 2008/0224617 | A1 | 9/2008 | Keller et al. |
| 2008/0249723 | A1 | 10/2008 | McAllister et al. |
| 2009/0102680 | A1 | 4/2009 | Roos |
| 2009/0115426 | A1 | 5/2009 | Muench, Jr. et al. |
| 2009/0146839 | A1 | 6/2009 | Reddy et al. |
| 2009/0167308 | A1 | 7/2009 | Lomes |
| 2009/0167418 | A1 | 7/2009 | Raghavan |
| 2009/0296488 | A1 | 12/2009 | Nguyen et al. |
| 2010/0074034 | A1 | 3/2010 | Cazzaniga |
| 2010/0244935 | A1 | 9/2010 | Kim et al. |
| 2012/0139335 | A1 | 6/2012 | Holland |
| 2012/0154023 | A1 | 6/2012 | Pan et al. |
| 2012/0181095 | A1 | 7/2012 | Lopez |

FOREIGN PATENT DOCUMENTS

| | | |
|---|---|---|
| EP | 0382929 | 12/1989 |
| EP | 0780515 | 6/1997 |
| FR | 2797356 | 2/2001 |
| JP | S64-041540 | 2/1989 |
| JP | 2501513 | 5/1990 |
| JP | 2154157 | 6/1990 |
| JP | 6074783 | 3/1994 |
| JP | H07-032000 | 2/1995 |
| JP | 08101246 | 4/1996 |
| JP | 09107318 | 4/1997 |
| JP | 10271651 | 10/1998 |
| JP | 2000171492 | 6/2000 |
| JP | 2002199625 | 7/2002 |
| JP | 2003069731 | 7/2003 |
| JP | 2004088771 | 3/2004 |
| JP | 2004320228 | 11/2004 |
| JP | 2005190481 | 7/2005 |
| JP | 2006344144 | 12/2006 |
| JP | 2007020268 | 1/2007 |
| JP | 2007214784 | 8/2007 |
| WO | WO0106336 | 1/2001 |
| WO | WO2006132757 | 12/2006 |
| WO | WO2007116835 | 10/2007 |

OTHER PUBLICATIONS

Chinese Office Action issued on Jul. 6, 2010 Chinese Patent Appl. No. 200780015356.0 (10 pages).

Communication Cable Inflator/Gas Pressure Centralized Monitoring and Management System, on pp. 44-46, 49 in No. 2 vol. 18 of Automation Techniques and Application in Hellongjiang—Summary attached to Chinese Office Action for Appl. No. 200780015356.0 dated Jul. 6, 2010 as Reference No. 1—See p. 7 (1 page).

European Examination Report issued on Feb. 5, 2011 for European Patent Appl. No. 07 758 717.8 —2006 (4 pages).

Chinese Office Action issued on Sep. 28, 2011 for Chinese Patent Appl. No. 200880005285.0 (16 pages).

Chinese Office Action issued on Nov. 14, 2012 for Chinese Patent Appl. No. 200880005285.0 (8 pages).

International Search Report and Written Opinion issued on Jul. 8, 2008 for International Patent Appl. No. PCT/US08/50583 (11 pages).

International Search Report and Written Opinion issued on Jul. 7, 2008 for International Patent Appl. No. PCT/US04/32880 (9 pages).

International Search Report and Written Opinion issued on Feb. 11, 2008 for International Patent Appl. No. PCT/US07/64196 (9 pages).

International Search Report and Written Opinion issued on Mar. 3, 2008 for International Patent Appl. No. PCT/US07/77418 (9 pages).

International Search Report and Written Opinion issued on Jul. 23, 2008 for International Patent Appl. No. PCT/US08/55613 (7 pages).

International Search Report and Written Opinion issued on Jul. 31, 2008 for International Patent Appl. No. PCT/US08/56008 (10 pages).

International Search Report and Written Opinion issued on Sep. 26, 2008 for International Patent Appl. No. PCT/US08/70879 (8 pages).

International Search Report and Written Opinion issued on Oct. 3, 2008 for International Patent Appl. No. PCT/US08/70881 (8 pages).

International Search Report and Written Opinion issued on May 8, 2009 for International Patent Appl. No. PCT/US09/35693 (5 pages).

Japanese Office Action issued on Sep. 4, 2012 for Japanese Patent Appl. No. P2009-545014 (8 pages).

Japanese Office Action issued on Feb. 14, 2012 for Japanese Patent Appl. No. P2009-500631 (6 pages).

International Search Report and Written Opinion issued on Jun. 3, 2008 for International Patent Appl. No. PCT/US04/26874 (5 pages).

International Search Report and Written Opinion issued on Nov. 2, 2005 for International Patent Appl. No. PCT/US04/32878 (5 pages).

* cited by examiner

METHOD AND APPARATUS FOR A VOICE-PROMPTED ELECTRICAL HOOKUP

RELATED APPLICATIONS

This application claims the benefit of U.S. Provisional Patent Application Ser. No. 61/033,576 entitled "METHOD AND APPARATUS FOR A VOICE-PROMPTED ELECTRICAL HOOKUP" and filed on Mar. 4, 2008, the entire contents of which is hereby incorporated by reference.

BACKGROUND

The increasing importance of power quality and reliability has produced an increasing need for electrical utilities to monitor their infrastructure with test equipment. In addition, end users who are interested in controlling energy consumption and improving efficiency also have a need to monitor their systems with electrical test equipment. Although the recommended practice in the past has been to disconnect all live voltage before connecting monitoring equipment, the trend today is towards maximum reliability and minimum outage time. For at least this reasons, it is desirable for the installer to connect any measurement equipment to voltage and current monitoring points with full voltage and current, to avoid interrupting power delivery.

Connecting electrical monitoring equipment to live voltage is hazardous, and adherence to multiple sets of safety regulations, including the NEC, OSHA, NFPA, and/or any other suitable safety regulations, is desirable. In particular, arc-flash equipment, including flame retardant clothing, full helmet, and insulating gloves, is useful for gaining access to many areas. Operating electronic equipment while wearing full protective clothing is very difficult due to limited visibility and manual dexterity.

In addition, connecting electrical monitoring equipment is very error-prone. Each voltage phase must be matched with the appropriate voltage input on the monitor, and each current channel to the corresponding current input. Further, the polarity of both the voltage and current inputs is also important for power and phase angle measurements. It can be difficult to determine the correct phase and polarity relationships by sight at many electrical monitoring points. Another complication is that specialized monitoring equipment is often only used infrequently, resulting in users who are unfamiliar with the correct instrument hookup.

For at least these reasons, it is desirable for the user to carefully read all hookup instructions for the instrument, pay attention to probe channel number and phasing, and correctly identify all monitoring points.

SUMMARY

In one embodiment, a user is provided with instant voice feedback as they are connecting monitoring equipment. Such feedback can reduce or eliminate confusing hookup instructions and enable the user to use both hands to safely connect the equipment without the distraction of looking at hard-to-read probe markings or connection labels. The use of a voice output, via a headset in various embodiments, reduces or avoids problems of poor visibility and reduced hearing in typical industrial environments, using arc flash safety gear.

In one embodiment, a method of connecting a monitoring device to an electrical system includes determining a connection configuration having a plurality of connections between the monitoring device and the electrical system. The method also includes prompting a user to make one of the plurality of connections between the monitoring device and the electrical system and providing feedback to the user if the one of the plurality of connections is incorrectly made.

In one embodiment, a system for connecting a monitoring device to an electrical system includes at least one monitoring device and at least one controller. The monitoring device is operable to couple with a portion of at least one electrical system. The at least one controller stores at least one set of connection configuration instructions for properly coupling the at least one monitoring device with the portion of the at least one electrical system. In this system, the controller is in communication with the monitoring device to receive at least one connection detection signal from the monitoring device based on at least one connection between the monitoring device and the portion of the at least one electrical system.

In another embodiment, a device for providing instructions on how to properly connect a monitoring device to at least one electrical system includes a monitoring device, a controller, and a connection notification unit. The monitoring device is operable to couple with a portion of at least one electrical system. The controller is coupled to the monitoring device, wherein the controller stores at least one set of configuration instructions for properly coupling the monitoring device with the portion of the at least one electrical system. The controller also detects at least one connection between the monitoring device and the portion of the at least one electrical system. The connection notification unit is coupled to the controller, wherein the connection notification unit receives at least one connection instruction from the controller and provides the at least connection instruction to a user.

Additional features and advantages are described herein, and will be apparent from, the following Detailed Description and the figures.

DETAILED DESCRIPTION

Figure 1:
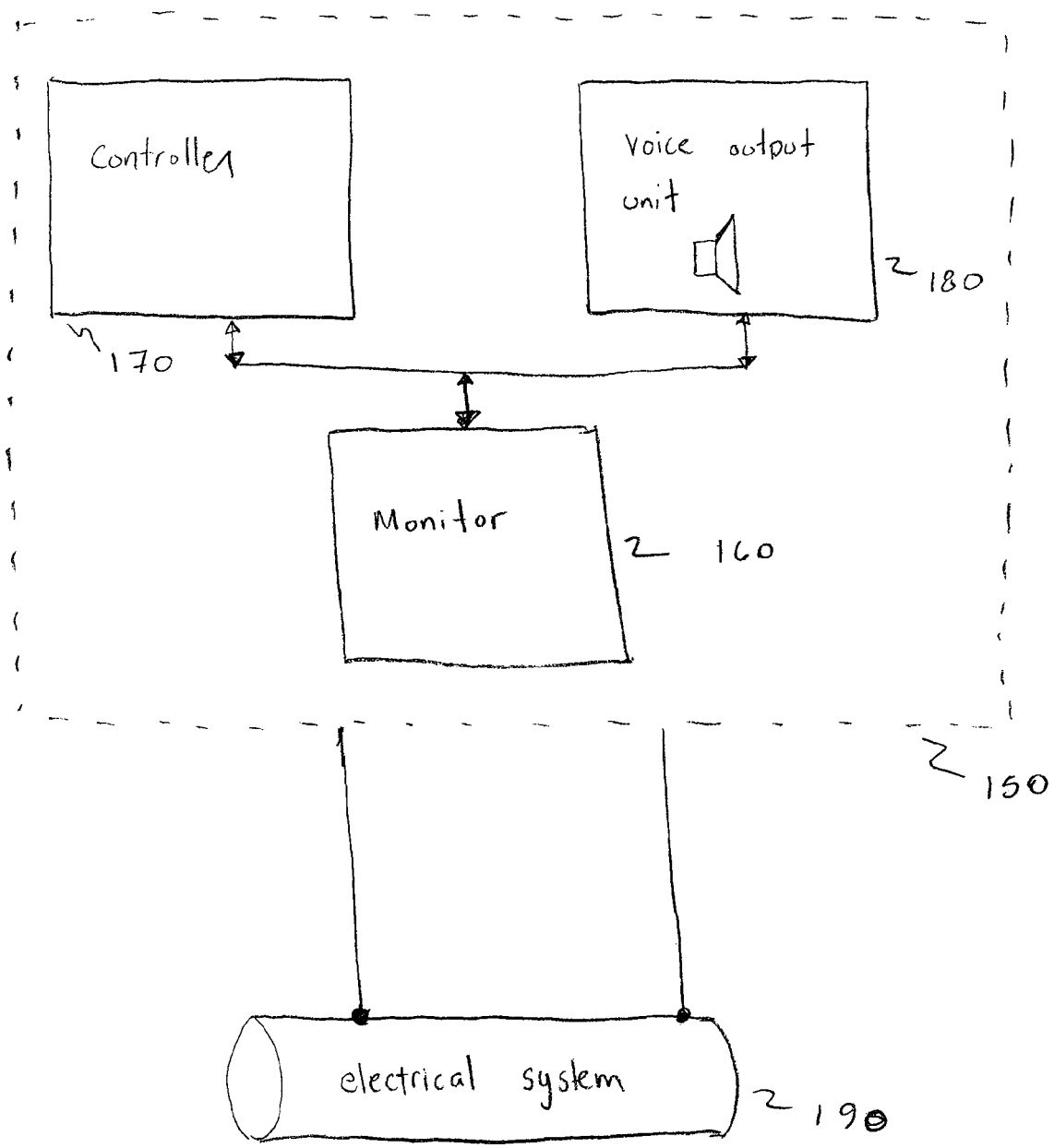
FIG. 1 is a network diagram of a system for connecting a monitor to an electrical system in accordance with one embodiment.

FIG. 1 illustrates one embodiment of a voice-prompted electrical hookup system 150 that includes a monitor 160, a controller 170, and a voice output unit 180 for connecting to at least one portion of at least one electrical system 190. In one embodiment, the monitor 160 is a power quality monitor, data logger, or any other suitable monitoring device, but can be any device connected to live voltage or current monitoring points. The controller 170 preferably determines or senses the connection of voltage and current probes by the user in real time, and determines the correct voice feedback to be generated and played to the user, based on the actual circuit type (wye, delta, etc.), and the actual connections the user has made in one embodiment; however, the controller 170 can determine or sense any suitable condition in any suitable manner and perform any suitable action. In one embodiment, the controller 170 is integrated into the monitor 160; however, in other embodiments, the controller 170 is part of a separate PDA or PC system. In one embodiment, the voice output unit 180 includes an audible transducer that plays the voice or other audible feedback to the user. The voice output unit 180 can be an integral speaker in the monitor 160 or controller 170, or a separate device, such as a Bluetooth headset, a frequency modulation (FM) receiver, a cell phone, or any other suitable device.

In one embodiment, the controller 170 generates appropriate voice messages or feedback to the user via the voice output unit 180; however, any type of message can be presented to the user via any suitable unit (e.g., the messages can include visual messages/notifications like text displays, flashing lights, or alternative audible messages/notifications). In another embodiment, the controller 170 provides messages/feedback through tactile sensations to the user such as vibrations. In one embodiment, a setup "wizard" starts automatically when the controller 170 determines or senses that the user has begun the connection process (connecting the monitor 160 to an electrical system) or when the setup wizard is initiated manually by the user. The controller 170 prompts (e.g., with audible instructions or commands) the user to make one connection at a time, in the correct sequence. As the user makes the connections between the monitor 160 and the electrical system 190, the controller 170 in communication with the monitor 160 senses the established connections, and provides appropriate voice or audible feedback about the connections (e.g., "Connection established" or "Connection incorrect"). When the user has made all the connections, the controller 170 informs the user (e.g., audibly) that the monitor 160 is ready for use.

FIG. 1 illustrates the process of connecting a monitor in accordance with one embodiment. At block 100, a controller prompts a user to make a connection. At block 102, the user makes a connection. At block 104, it is determined whether the connection is properly made. If the connection is properly made, at block 106, it is determined whether there are additional connections to be made remaining. If there are no additional connections remaining, at block 108, the controller informs the user that the monitor is correctly connected. If there are additional connections remaining, the process repeats at block 100. If the connection is not properly made, at block 110, the controller informs the user of the incorrect connection, prompts the user to disconnect the incorrect connection and make the correct connection and the process repeats at block 104.

In one embodiment in which the three components (e.g., the monitor 160, the controller 170, and the voice output unit 180) are separate devices, a communication connection exists between them. Preferably, communications connection is a wireless connection, such as Bluetooth or FM broadcasts; however, the communications connection can be wired, if desired.

In one embodiment the monitor 160, controller 170, and voice output unit 180 are separate devices. In one embodiment, the monitor 160 is a PMI Eagle™ or any other suitable monitoring device. This power quality monitor has at least four voltage and four current inputs, and is suitable for many different electrical connections. The Eagle includes an integral Bluetooth module for wireless communications. It should be understood that other suitable monitors having other characteristics are used in other embodiments.

In one embodiment, the controller 170 can be a handheld PDA, such as a Pocket PC or PalmOS device; however, the controller 170 can be any suitable device, such as a cell phone, or a cell phone with PDA capability. The controller 170 interfaces with the monitor 160, in one embodiment, using Bluetooth. In another embodiment, controller 170 interfaces with the monitor 160 using FM broadcasts; however, it should be appreciated that any other suitable interface protocol can be used. Preferably, software loaded onto a PDA runs the controller code; however, the controller code can be implemented in special purpose hardware, if desired.

In one embodiment, the voice output unit 180 includes a Bluetooth headset. In an alternative embodiment, the voice output unit 180 includes an FM headset receiver. Such headsets can be worn under an arc-flash head covering, and doesn't require any wires to the controller 170. Use of a headset reduces or eliminates problems that may exist with hearing a voice output through the arc-flash gear and/or in a noisy industrial setting. In various embodiments, noise cancellation headphones or earphones are used in an environment in which hearing protection is desirable. In various other embodiments, other wireless or wired headphones or headsets could also be used for the voice output unit 180.

In other embodiments, any of the above components may be combined. For example, the controller may be integrated into the monitor. In this case, the monitor/controller could connect directly to the voice output device. The controller and voice device could be combined. In one embodiment, the controller is a handheld PDA, and a speaker integrated into the PDA is the voice output unit. A headset with sufficient computing power could also perform the controller tasks. In one embodiment, all three components are integrated into a single device (e.g., the voice prompted electrical hookup system 150 is a device that includes monitor 160, controller 170, and on-board audio output unit such as voice output unit 180).

In various embodiments, the components can be located in different locations. In particular, the controller 170 can be located in a remote location, such as a computer server at another location remote from monitor 160. In one embodiment in which the monitor 160 is networked (e.g. with Bluetooth or other wireless or wired connection to a LAN) and the Bluetooth headset also has a network connection, the controller 170 can be located remotely and connects to other components via the LAN. The controller 170 or headset 180 may also be connected via a cell phone or other consumer electronic device with suitable capability.

In another embodiment, at least some of the controller 170 functions are performed by an actual person rather than an electronic or computer system. For example, in the networked case above, the controller 170 in the remote location could be assisted with a technical support person on a phone line or other communications connection to a field user (e.g., via cell phone and headset), or other networked voice connection (e.g. VOIP). The support person could walk the user through the proper connection process, offering feedback and corrections as needed. In one embodiment, the support person could receive the connection measurements and data from the monitor/recorder 160 in real-time or in any other suitable manner, similar to the way in which the automated controller 170 of other embodiments receives data. In another embodiment, the remote controller 170 is at least partly automated, having a provision to escalate the process to a human tech support person upon a condition being satisfied. For example, this escalation could be automatic if the controller 170 determines that human intervention is desirable (due to at least one or repeated mistakes by the field user, for example or any other suitable condition), or it could be manual if requested by the field user. A provision for the field user to signal a desire to escalate could be some manipulation of the monitor/recorder 160 leads (e.g., repeated tapping of a voltage channel to live voltage or connection and disconnection of the current probes or any other suitable signal).

Figure 2:
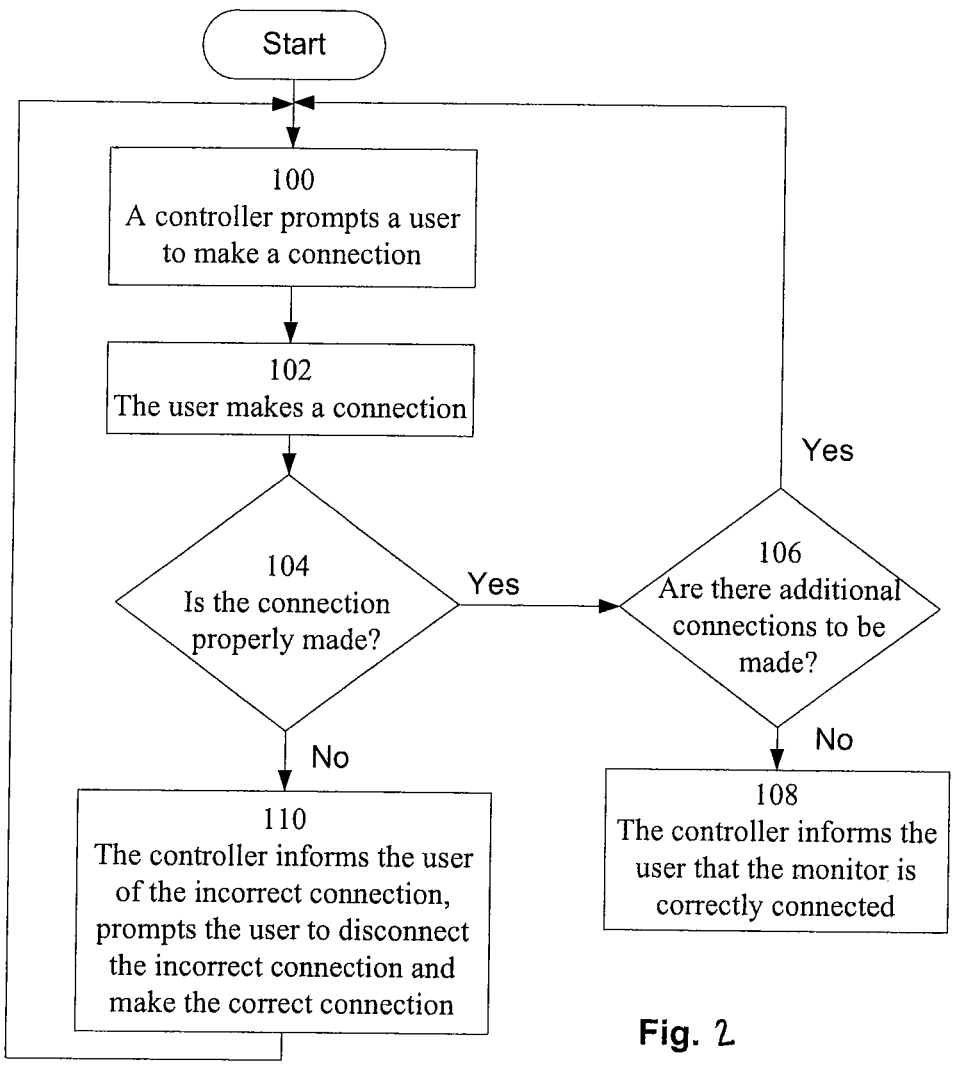
FIG. 2 is a flow diagram of the process of connecting a monitor in accordance with one embodiment.

FIG. 2 illustrates the process of connecting a monitor and detecting when live customer assistance is desirable in accordance with one embodiment. At block 200, it is determined whether the user requests live help. If the user requests live help, at block 202, the user is connected with a human technician who helps the user to connect the monitor. If the user does not request live help, at block 204, a controller prompts a user to make a connection. At block 206, the user makes a connection. At block 208, it is determined whether the connection is properly made. If the connection is properly made, at block 210, it is determined whether there are additional connections to be made. If there are no additional connections remaining, at block 212, the controller informs the user that the monitor is correctly connected. If there are additional connections remaining, the process repeats at block 200. If the connection is not properly made, at block 214, it is determined whether user's erroneous connections history for the connection process meets a threshold condition. If the user's erroneous connections history meets the threshold condition, the process continues at block 202. If the user's erroneous connections history does not meet the threshold condition, at block 216, the controller informs the user of the incorrect connection, prompts the user to disconnect the incorrect connection and make the correct connection and the process repeats at block 200.

In one embodiment, the controller 170 includes a plurality of connection configuration instructions (e.g., hookup configurations) that guide a user to properly connect a monitoring device 160 to different electrical systems. It should also be appreciated that the controller 170 can download or receive new and updated connection configuration instructions. In one embodiment, the controller 170 determines the correct monitor 160 hookup configuration from user input (e.g. voice input using recognition software, or keypad/touch screen selecting one of the appropriate connection configuration instructions). In an alternative embodiment, the monitor 160 provides the controller 170 with appropriate connection configuration instructions to use. In another embodiment, controller 170 includes sensors that read bar coded or RFID tagged equipment to determine the appropriate connection configuration instructions to use. Thus, it should be appreciated that controller 170 can determine the correct monitor 160 hookup configuration in any suitable manner. In accordance with the desired connection configuration instructions and circuit type, the controller 170 determines a connection procedure, optimized for minimum number of steps and confusion for the user.

In one embodiment, the user is prompted before each step using voice messages; however, the user can be prompted at any suitable point in any suitable manner. Preferably, the controller 170 receives notice from the monitor 160 when the user actually makes a connection (either by polling, or through alerts from the monitor 160); however, the controller 170 can receive notice at any suitable time in any suitable manner. Further, the controller 170 informs the user of what connection was sensed in one embodiment. The controller 170 then determines whether the connection just performed by the user was correct. If the connection was correct, the user is informed that the connection is correct and prompted to perform the next step; however, in other embodiments, the user is merely prompted to perform the next step without confirming that the previous step was completed successfully.

If the connection is not correct, in one embodiment, the controller 170 prompts the user to correct the mistake. In an alternative embodiment, if the connection mistake can be fixed by altering the monitor 160 configuration, the controller 170 alters the monitor configuration and computes a new connection plan based on the connections already made. For example, if the user errantly connects Phase A voltage to input channel 2 instead of channel 1, this may be correctable by the monitor 160 by reassigning logical channel numbers. Instead of prompting the user to fix the connection, the controller 170 instructs the monitor to expect Phase A voltage on channel 2 and determines new channel assignments for the remaining phases. As a result, the amount of corrections the user may have to perform or correct if they make a mistake during the process is reduced.

In an alternative embodiment, the wrong connection configuration instructions may have been determined at controller 170 for connecting monitor 160 to an electrical system. For example, the user may have provided controller 170 the wrong type of electrical system or electrical device. Thus, controller 170 provides the wrong connection configuration or hookup instructions. However, in one such embodiment, the controller 170 can still determine if the monitor 160 has been properly connected to an electrical system based on an analysis of the couplings between the monitor 160 and the electrical system, regardless of the wrong instructions. If any connection problems are detected, the controller 170 can provide instructions to the user on how to correct the problem as discussed above.

Figure 3:
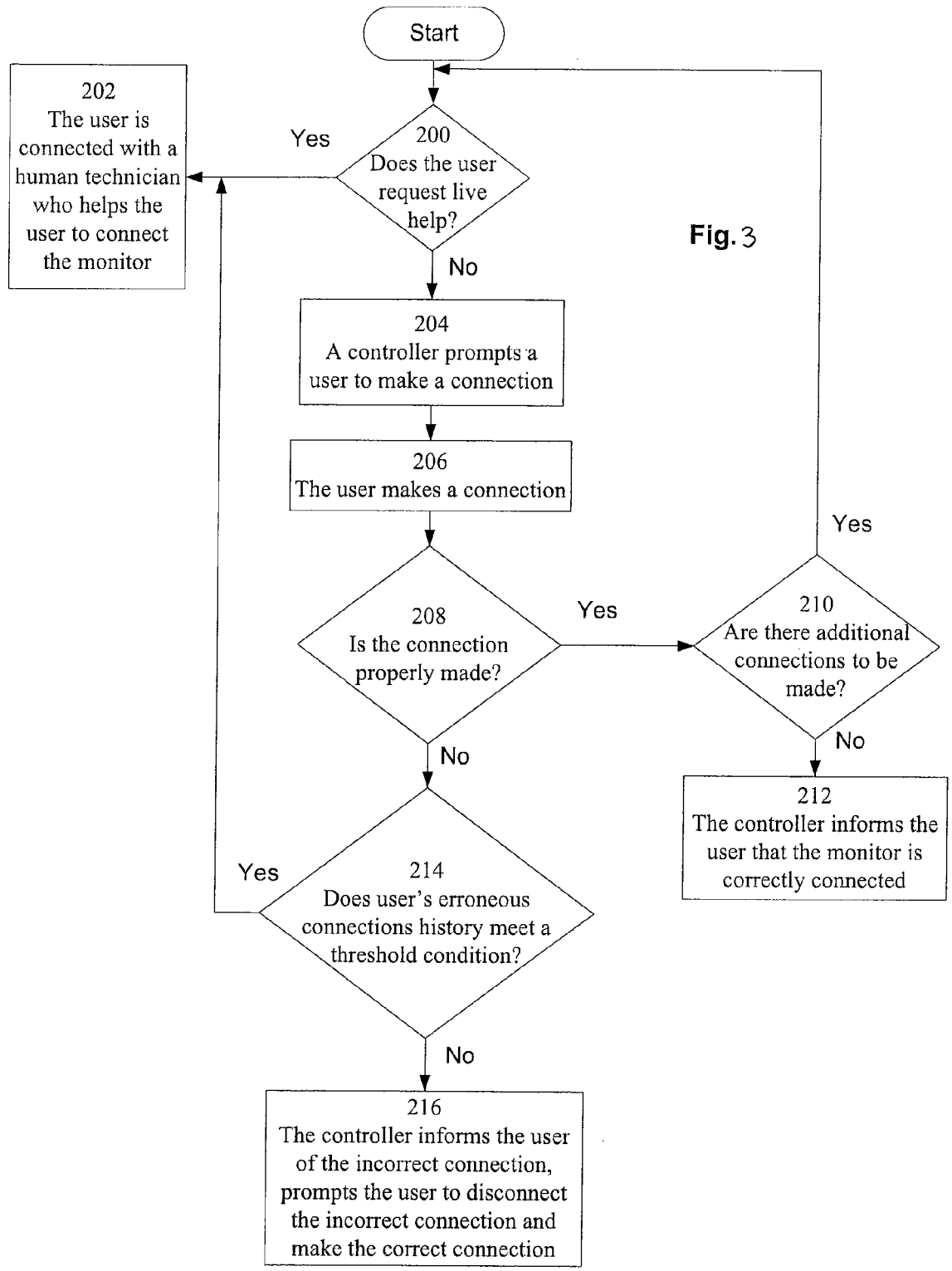
FIG. 3 is a flow diagram of the process of connecting a monitor to an electrical system and detecting when live customer assistance is desirable in accordance with one embodiment.
Figure 4:
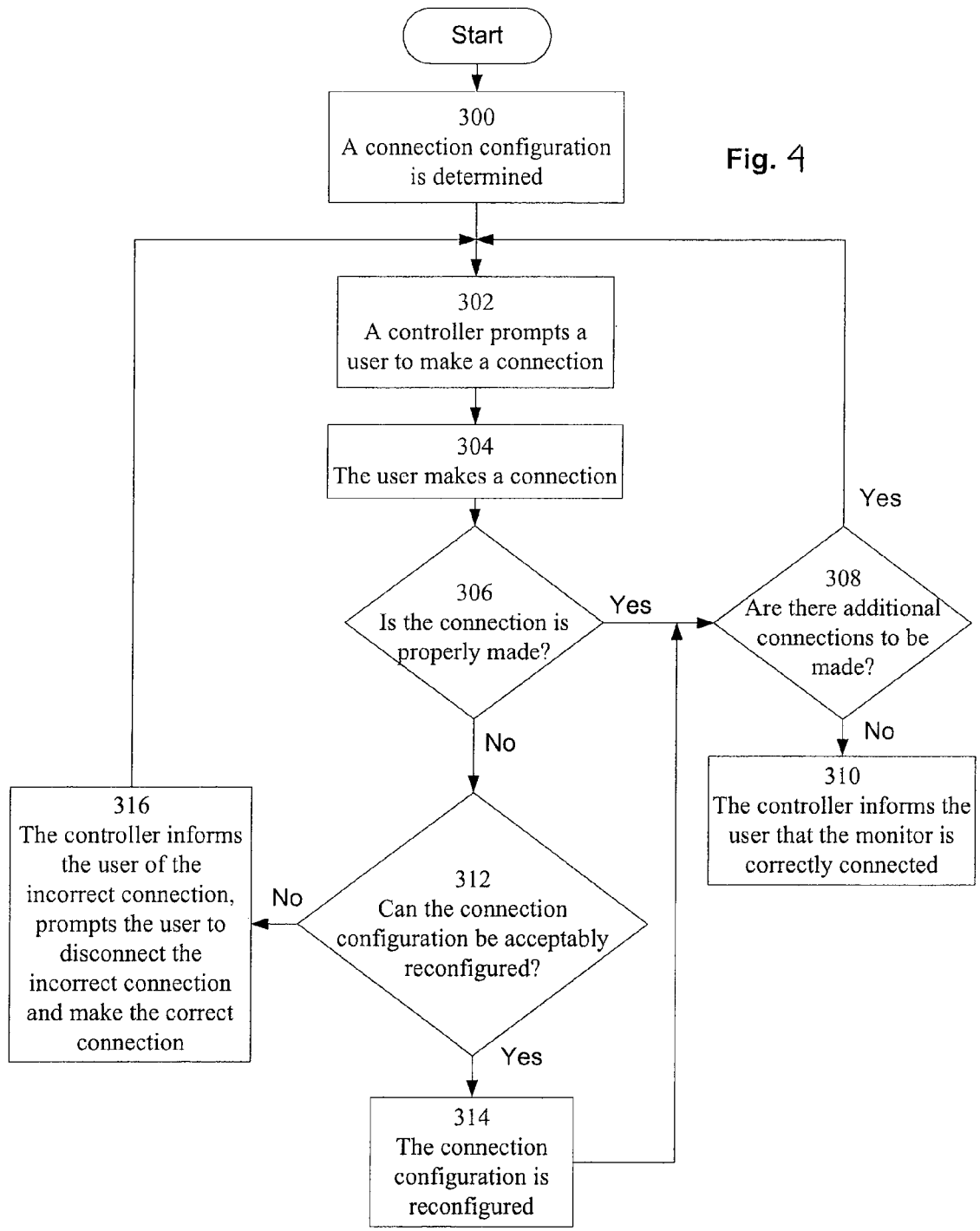
FIG. 4 is a flow diagram of the process of connecting a monitor to an electrical system and reconfiguring the connection if necessary during the connection process in accordance with one embodiment.

FIG. 3 illustrates the process of connecting a monitor and reconfiguring the connection if necessary during connection in accordance with one embodiment. At block 300, a connection configuration is determined. At block 302, a controller prompts a user to make a connection. At block 304, the user makes a connection. At block 306, it is determined whether the connection is properly made. If the connection is properly made, at block 308, it is determined whether there are additional connections to be made remaining. If there are no additional connections remaining, at block 310, the controller informs the user that the monitor is correctly connected. If there are additional connections remaining, the process repeats at block 302. If the connection is not properly made, at block 312, it is determined whether the connection configuration can be acceptably reconfigured such that all current connections, including the recent erroneous connection, would be correct. It should be noted that in various embodiments, any reconfiguration that causes the current connections to be correct is acceptable, and in various other embodiments, such reconfigurations are acceptable if they do not increase the complexity, number or difficulty of remaining connections to be made beyond a threshold level. If the connection configuration can be acceptably reconfigured, at block 314, the connection configuration is reconfigured and the process continues at block 308. If the connection configuration can not be acceptably reconfigured, at block 316, the controller informs the user of the incorrect connection, prompts the user to disconnect the incorrect connection and make the correct connection and the process repeats at block 302.

In one embodiment, upon completion of the hookup configuration process the controller 170 confirms the circuit type and desired hookup configuration through the voice output unit, giving the user a positive confirmation; however, in other embodiments confirmation is provided in other suitable manners or not at all. If the user decides that the announced hookup is incorrect, the user can change the connection type using the controller 170 interface. In such an instance, the controller 170 re-computes the optimal reconnect strategy (in accordance with the connections already made), and the process begins again. In an alternate embodiment, the user can disconnect a voltage or current probe without informing the controller 170. In one such embodiment, the controller 170 detects the probe change from the monitor 160 and prompts the user to enter a new desired hookup type.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of connecting a monitoring device to an electrical system comprising:
   determining from among a plurality of connection configurations, a connection configuration based on a received input, the connection configuration identifying a plurality of connections between the electrical system and a plurality of voltage probes and a plurality of current probes of the monitoring device, wherein the connections are made to a live voltage of the electrical system;
   prompting a user to make one of the plurality of connections between the monitoring device and the electrical system;
   determining that the one of the plurality of connections is incorrectly made; and
   determining, responsive to determining that the one of the plurality of connections is incorrectly made, whether the connection configuration can be acceptably reconfigured, and if the connection configuration cannot be acceptably reconfigured, providing feedback to the user, the feedback being transmitted to a communicatively coupled voice output unit that outputs audio feedback including (i) identification of the incorrectly made connection and (ii) identification of a proper connection to correct the incorrect connection.

2. The method of claim 1, wherein a controller determines whether to provide the feedback to the user.

3. The method of claim 2, wherein the voice output unit is in communication with the controller.

4. The method of claim 3, wherein the audio feedback includes at least a portion of voice feedback.

5. The method of claim 4, wherein the voice output unit and the controller are in wireless communication.

6. The method of claim 5, wherein the controller transmits voice feedback to the voice output unit using frequency modulation broadcasts.

7. The method of claim 1, further comprising reconfiguring the connection configuration if the connection configuration can be acceptably reconfigured.

8. The method of claim 1, wherein if the one of the plurality of connections is made incorrectly, determining whether an error history satisfies a condition with a controller that is in communication with the monitoring device.

9. The method of claim 8, wherein if the error history satisfies the condition, automatically establishing live communication between the user and a helper.

10. The method of claim 1, wherein if the connection configuration can be acceptably reconfigured, reconfiguring the connection configuration and providing feedback including a notification that a correct connection was made between the monitoring device and the electrical system.

11. A system for connecting a monitoring device to an electrical system, the system comprising:
    at least one monitoring device comprising a plurality of voltage probes and a plurality of current probes, wherein the monitoring device is operable to couple with a portion of at least one electrical system; and
    at least one controller, the controller storing a plurality of connection configuration instructions for properly coupling the at least one monitoring device with the portion of the at least one electrical system, the controller being configured to:
      select a set of connection configuration instructions from the plurality of connection configuration instructions based on a received input,
      determine that one of a plurality of connections is incorrectly made, and
      determine whether the connection configuration can be acceptably reconfigured;
    wherein the controller is in communication with the monitoring device to receive at least one connection detection signal from the monitoring device based on at least one connection between the monitoring device and the portion of the at least one electrical system,
    wherein the connection is made to a live voltage of the electrical system, and
    wherein when the connection configuration cannot be acceptably reconfigured, the controller transmits feedback to a communicatively coupled connection notification unit that outputs audio feedback including (i) identification of the incorrectly made connection and (ii) identification of a proper connection to correct the incorrect connection.

12. The system of claim 11, wherein the controller provides at least one notification of at least one improper connection between the at least one monitoring device and the at least one portion of the at least one electrical system based on the received at least one connection detection signal.

13. The system of claim 12, connection notification unit in communication with the controller.

14. The system of claim 13, wherein the connection notification unit is a voice output unit in communication with the controller and the at least one notification is voice feedback.

15. The system of claim 14, wherein the controller and the voice output unit are in wireless communication.

16. The system of claim 11, wherein the monitoring device and the controller are in wireless communication.

17. The system of claim 16, wherein the controller transmits at least some voice feedback to a voice output unit using frequency modulation broadcasts.

18. The system of claim 11, wherein the controller is configured to:
    filter at least some of the sets of connection configuration instructions based on a second received input of a second identifier provided by the electrical system; and
    prompt the user to select the set of connection configuration instructions from among the filtered sets of connection configuration instructions.

19. A device for providing instructions on how to properly connect a monitoring device to at least one electrical system, the device comprising:
    a controller configured to be coupled to a monitoring device that is operable to couple with a portion of at least one electrical system through a plurality of voltage probes and a plurality of current probes, wherein the controller stores a plurality of configuration instructions for properly coupling the monitoring device with the portion of the at least one electrical system, detects at least one connection between the monitoring device and the portion of the at least one electrical system, and determines whether the at least one connection is made correctly or incorrectly according to the configuration instructions, wherein the connection is made to a live voltage of the electrical system, wherein the controller is configured to determine whether the configuration can be acceptably reconfigured if the at least one connection is made incorrectly and whether an error history satisfies a condition if the at least one connection is made incorrectly; and a connection notification unit coupled to the controller, wherein the connection notification unit receives at least one connection instruction from the controller, provides the at least connection instruction to a user, and automatically establishes live communication between the user and a helper responsive to the error history satisfying the condition.

\* \* \* \* \*